United States Patent
Koyanagi et al.

(10) Patent No.: US 9,401,324 B2
(45) Date of Patent: Jul. 26, 2016

(54) SEMICONDUCTOR DEVICE HAVING AN ON DIE TERMINATION CIRCUIT

(71) Applicant: Kabushiki Kaisha Toshiba, Minato-ku (JP)

(72) Inventors: Masaru Koyanagi, Tokyo (JP); Yasuhiro Suematsu, Kanagawa (JP)

(73) Assignee: Kabushiki Kaisha Toshiba, Minato-ku (JP)

(*) Notice: Subject to any disclaimer, the term of this patent is extended or adjusted under 35 U.S.C. 154(b) by 199 days.

(21) Appl. No.: 14/023,962

(22) Filed: Sep. 11, 2013

(65) Prior Publication Data

US 2015/0008582 A1    Jan. 8, 2015

Related U.S. Application Data

(60) Provisional application No. 61/843,184, filed on Jul. 5, 2013.

(51) Int. Cl.
| | |
|---|---|
| *H01L 23/485* | (2006.01) |
| *H01L 23/522* | (2006.01) |
| *H01L 25/10* | (2006.01) |
| *H01L 27/02* | (2006.01) |
| *H01L 27/06* | (2006.01) |
| *H01L 25/065* | (2006.01) |

(52) U.S. Cl.
CPC ............ *H01L 23/5228* (2013.01); *H01L 25/10* (2013.01); *H01L 27/0207* (2013.01); *H01L 27/0629* (2013.01); *H01L 25/0657* (2013.01); *H01L 2224/48091* (2013.01); *H01L 2224/48145* (2013.01); *H01L 2224/48227* (2013.01); *H01L 2224/73215* (2013.01); *H01L 2224/73265* (2013.01); *H01L 2225/06562* (2013.01); *H01L 2924/01013* (2013.01); *H01L 2924/01074* (2013.01); *H01L 2924/15311* (2013.01)

(58) Field of Classification Search
CPC ............ H01L 2224/73215; H01L 2224/73265; H01L 25/0657; H01L 2924/01013; H01L 2924/01074
USPC .................................................. 257/751, 767
See application file for complete search history.

(56) References Cited

U.S. PATENT DOCUMENTS

| | | | | |
|---|---|---|---|---|
| 6,501,108 | B1 * | 12/2002 | Suzuki et al. | 257/210 |
| 7,106,092 | B2 | 9/2006 | Kubo | |
| 7,180,137 | B2 | 2/2007 | Hayakawa et al. | |

(Continued)

FOREIGN PATENT DOCUMENTS

| | | |
|---|---|---|
| JP | 7-152461 | 6/1995 |
| JP | 2004-146485 | 5/2004 |

(Continued)

OTHER PUBLICATIONS

Office Action issued May 12, 2015 in Taiwanese Patent Application No. 102138309 (with English language translation).

*Primary Examiner* — Marc Armand
*Assistant Examiner* — Tifney Skyles
(74) *Attorney, Agent, or Firm* — Oblon, McClelland, Maier & Neustadt, L.L.P.

(57) ABSTRACT

According to one embodiment, a semiconductor device includes a transistor formed on a semiconductor chip, a lower-layer wiring connected to a diffusion layer of the transistor, and drawn outside the diffusion layer, and an upper-layer wiring drawn out from a pad electrode formed on the semiconductor chip, connected to the lower-layer wiring, and having resistivity lower than that of the lower-layer wiring.

19 Claims, 9 Drawing Sheets

(56) References Cited

U.S. PATENT DOCUMENTS

| | | |
|---|---|---|
| 7,791,852 B2 | 9/2010 | Otsuka et al. |
| 2011/0084385 A1* | 4/2011 | Itaya et al. .................... 257/737 |
| 2012/0250264 A1 | 10/2012 | Osanai et al. |

FOREIGN PATENT DOCUMENTS

| | | |
|---|---|---|
| JP | 2004-342897 | 12/2004 |
| JP | 2008-10542 | 1/2008 |
| JP | 2012-203807 | 10/2012 |

* cited by examiner

SEMICONDUCTOR DEVICE HAVING AN ON DIE TERMINATION CIRCUIT

CROSS-REFERENCE TO RELATED APPLICATIONS

This application is based upon and claims the benefit of priority from Provisional Patent Application No. 61/843,184, filed on Jul. 5, 2013; the entire contents of which are incorporated herein by reference.

FIELD

Embodiments described herein generally relate to a semiconductor device.

BACKGROUND

In tandem with an increase in interface speed, the semiconductor device uses an ODT (On Die Termination) circuit as its IO termination in some cases.

DETAILED DESCRIPTION

In general, according to one embodiment, a transistor, a lower-layer wiring, and an upper-layer wiring are provided on a semiconductor chip. The lower-layer wiring is connected to a diffusion layer of the transistor, and drawn outside the diffusion layer. The upper-layer wiring is drawn from a pad electrode formed on the semiconductor chip and connected to the lower-layer wiring, and has resistivity lower than that of the lower-layer wiring.

Hereinafter, with reference to the accompanying drawings, a semiconductor device according to the embodiments will be described in detail. In addition, the present invention is not limited to the embodiments.

First Embodiment

Figure 1:
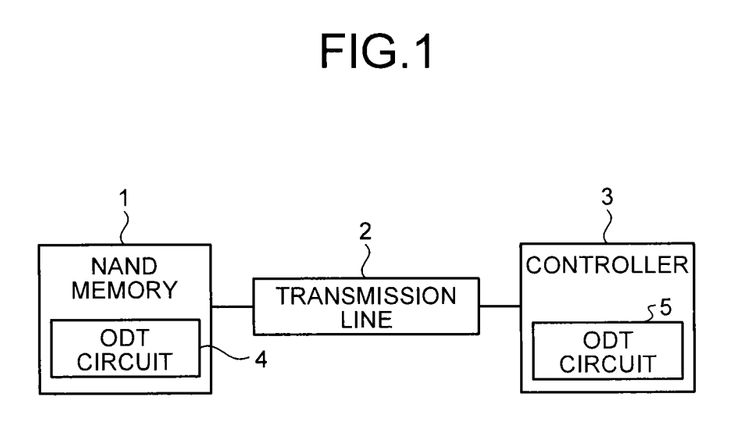
FIG. 1 is a block diagram illustrating a system configuration of a semiconductor device according to a first embodiment.

FIG. 1 is a block diagram illustrating a system configuration of a semiconductor device according to a first embodiment.

Referring to FIG. 1, a NAND memory 1 is connected to a controller 3 through a transmission line 2. In addition, the controller 3 can perform reading/writing control, block selection, and error correction in the NAND memory 1. The NAND memory 1 uses an ODT circuit 4 as an IO termination. The controller 3 uses an ODT circuit 5 as an IO termination. Here, the ODT circuit 4 can achieve impedance matching with the transmission line 2 when a signal is inputted to the NAND memory 1, or limit upper and lower limits of the signal inputted to the NAND memory 1. The ODT circuit 5 can achieve impedance matching with the transmission line 2 when a signal is inputted to the controller 3, or limit upper and lower limits of a signal inputted to the controller 3.

Figure 2A:
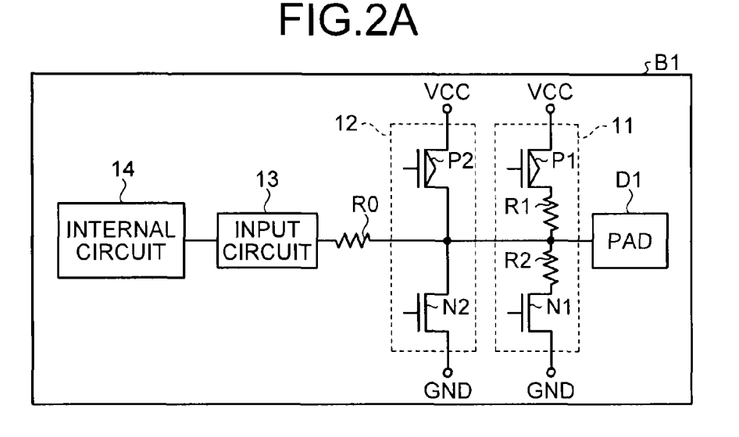
FIG. 2A, FIG. 2B, and FIG. 2C are block diagrams each illustrating a schematic configuration example of a semiconductor chip used in a NAND memory in FIG. 1.
Figure 2B:
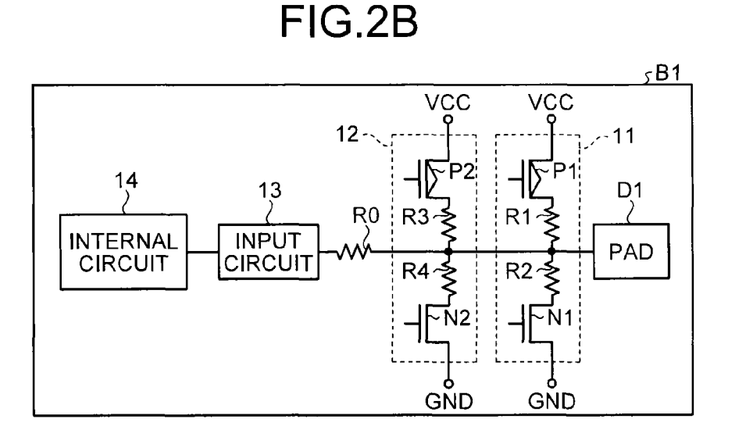
Figure 2C:
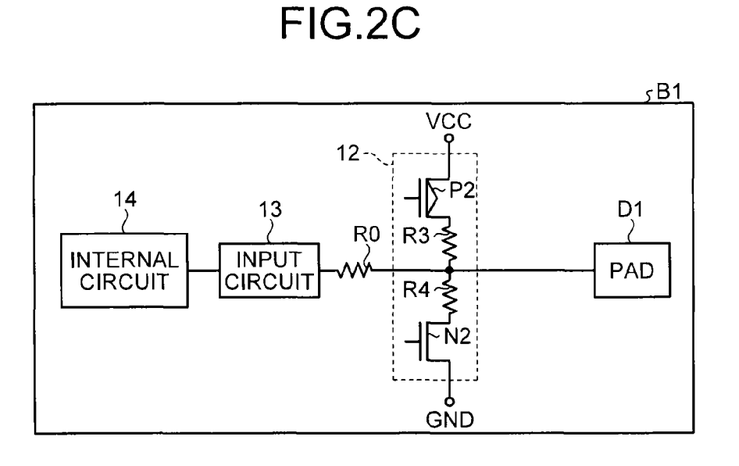

FIG. 2A, FIG. 2B and FIG. 2C are block diagrams each illustrating a schematic configuration example of a semiconductor chip used in the NAND memory in FIG. 1.

Referring to FIG. 2A, a pad electrode D1 is provided in a semiconductor chip B1, and the pad electrode D1 is connected to an ODT circuit 11, an output buffer 12, a protective resistor R0, and an input circuit 13, and connected to an internal circuit 14 through the output buffer 12 and the input circuit 13. In the internal circuit 14, a memory cell array, a row decoder, and a column decoder in the NAND memory 1 may be provided.

The ODT circuit 11 includes a P-type transistor P1, an N-type transistor N1, and resistors R1 and R2. The P-type transistor P1 and the resistor R1 are connected in series with each other, and the N-type transistor N1 and the resistor R2 are connected in series with each other. A connection point of the resistors R1 and R2 is connected to the pad electrode D1. A source of the P-type transistor P1 is connected to a power supply potential VCC, and a source of the N-type transistor N1 is connected to a ground potential GND.

The output buffer 12 includes a P-type transistor P2 and an N-type transistor N2. A connection point of the P-type transistor P2 and the N-type transistor N2 is connected to the pad electrode D1. A source of the P-type transistor P2 is connected to the power supply potential VCC, and a source of the N-type transistor N2 is connected to the ground potential GND. The ODT circuit may be also partially used as the output buffer.

Thus, when a signal is inputted to the pad electrode D1, the P-type transistor P2 and the N-type transistor N2 are turned off. In addition, when the P-type transistor P1 and the N-type transistor N1 are turned on, the pad electrode D1 is set to an intermediate potential between the power supply potential VCC and the ground potential GND. At this time, when a combined resistance value of the resistors R1 and R2 is conformed to a resistance value of the transmission line 2, the impedance matching with the transmission line 2 can be achieved. Therefore, the signal inputted to the pad electrode D1 through the transmission line 2 can be prevented from being reflected, and the signal can be efficiently transmitted. In addition, the upper and lower limits of the signal inputted to the pad electrode D1 through the transmission line 2 can be limited by the resistors R1 and R2, and the signal can be reduced in amplitude.

FIG. 2B illustrates a case where the output buffer 12 also includes transistors and resistor elements connected in series, similar to the ODT circuit. When the resistor is inserted in the output buffer, there is an advantage that drive resistance at the time of outputting can be linearized and the impedance matching with a board wiring can be further easily achieved. The output buffer 12 includes the P-type transistor P2, the N-type transistor N2, and resistors R3 and R4. The P-type transistor P2 and the resistor R3 are connected in series with each other, and the N-type transistor N2 and the resistor R4 are connected in series with each other. A connection point of the resistors R3 and R4 is connected to the pad electrode D1. The source of the P-type transistor P2 is connected to the power supply potential VCC, and the source of the N-type transistor N2 is connected to the ground potential GND.

FIG. 2C illustrates a case where only the output buffer 12 is provided. When the resistor is inserted into the output buffer, there is an advantage that drive resistance at the time of outputting is linearized and the impedance matching with the board wiring can be further easily achieved, similar to FIG. 2B. The output buffer 12 includes the P-type transistor P2, the N-type transistor N2, and the resistors R3 and R4. The P-type transistor P2 and the resistor R3 are connected in series with each other, and the N-type transistor N2 and the resistor R4 are connected in series with each other. The connection point of the resistors R3 and R4 is connected to the pad electrode D1. The source of the P-type transistor P2 is connected to the power supply potential VCC, and the source of the N-type transistor N2 is connected to the ground potential GND. The output buffer may partially function as the ODT.

Figure 3A:
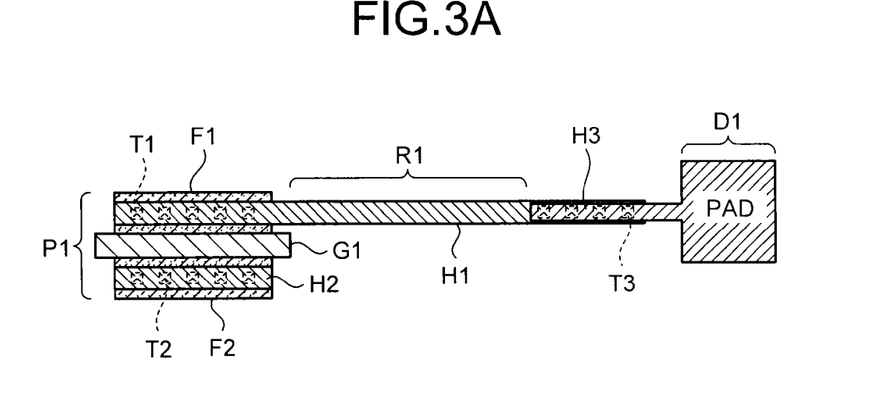
FIG. 3A is a plan view illustrating a configuration example of a P-type transistor P1 and a resistor R1 in FIG. 2A and FIG. 2B, and a P-type transistor P2 and a resistor R3 in FIG. 2B and FIG. 2C.
Figure 3B:
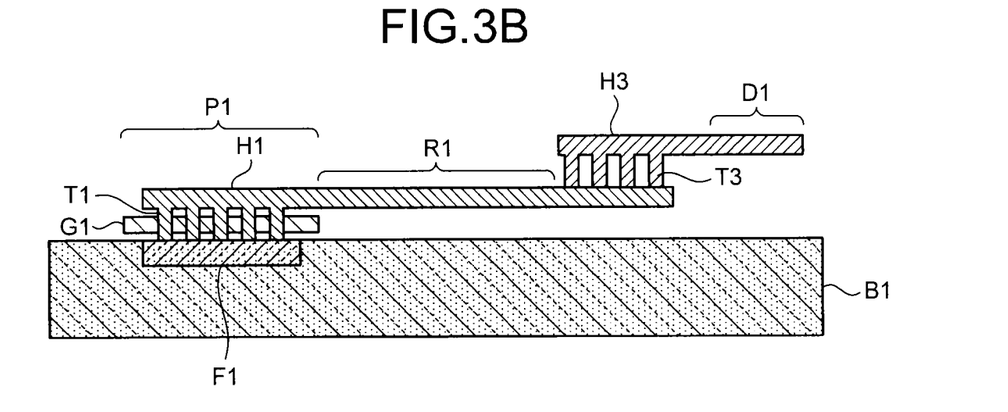
FIG. 3B is a cross-sectional view cut along a wiring H1 in FIG. 3A.

FIG. 3A is a plan view illustrating a configuration example of the P-type transistor P1 and the resistor R1 in FIG. 2A and FIG. 2B, and the P-type transistor P2 and the resistor R3 in FIG. 2B and FIG. 2C, and FIG. 3B is a cross-sectional view cut along a wiring H1 in FIG. 3A. The output buffer having the transistor and the resistor element connected in series has the same configuration as those of the ODT circuit and ODT, so that the ODT circuit is described as a representative below, but the output buffer having the transistor and the resistor element connected in series is included as a target therein, similar to the ODT.

Referring to FIG. 3A and FIG. 3B, the semiconductor chip B1 has a gate electrode G1. In addition, as a material of the semiconductor chip B1, single-crystal silicon can be used, and as a material of the gate electrode G1, polycrystal silicon can be used. Diffusion layers F1 and F2 are provided on both sides of a channel region under the gate electrode G1. In addition, the gate electrode G1 and the diffusion layers F1 and F2 may be used as the P-type transistor P1 in FIG. 2. At this time, the diffusion layer F1 can compose a drain of the P-type transistor P1, and the diffusion layer F2 can compose the source of the P-type transistor P1.

A lower-layer wiring H1 is formed on the diffusion layer F1, and the lower-layer wiring H1 is drawn outside the diffusion layer F1. The lower-layer wiring H1 is connected to the diffusion layer F1 through a contact T1. In addition, in order to reduce wiring capacity of the lower-layer wiring H1, it is preferable that the lower-layer wiring H1 does not overlap with the gate electrode G1. A lower-layer wiring H2 is formed on the diffusion layer F2, and the lower-layer wiring H2 is connected to the diffusion layer F2 through a contact T2.

In addition, the pad electrode D1 is provided in the semiconductor chip B1, and an upper-layer wiring H3 is drawn out from the pad electrode D1. The upper-layer wiring H3 is connected to the lower-layer wiring H1 through a contact T3. The lower-layer wiring H1 can be made of material having resistivity higher than that of the upper-layer wiring H3. At this time, the lower-layer wiring H1 may be made of material having a melting point higher than that of the upper-layer wiring H3, or the lower-layer wiring H1 may be made of material having electromigration resistance higher than that of the upper-layer wiring H3. For example, the lower-layer wiring H1 can be made of W, and the upper-layer wiring H3 can be made of Al. In the drawing, in addition to the lower-layer wiring H1, only the upper-layer wiring H3 is illustrated, but plural wiring layer may exist as the upper layer wirings of the H1. For example, a configuration may be provided such that a Cu wiring exists between the lower-layer wiring H1 and the upper-layer wiring H3. The same is true in the following examples although only the H3 is illustrated as the upper-layer wiring.

Here, the lower-layer wiring H1 drawn outside the diffusion layer F1 can be used as the resistor R1 in FIG. 2. Thus, it is not necessary to separately form the resistor element used as the resistor R1 in FIG. 2, so that the wiring capacity used for connecting the resistor element can be reduced, and as a result, signal transmission speed can be improved. In addition, a value of the resistor R1 can be prevented from varying, and the electromigration can be reduced, so that reliability of the ODT circuit 11 can be improved. In addition, the resistor R2 can be configured similarly to the resistor R1.

Second Embodiment

Figure 4:
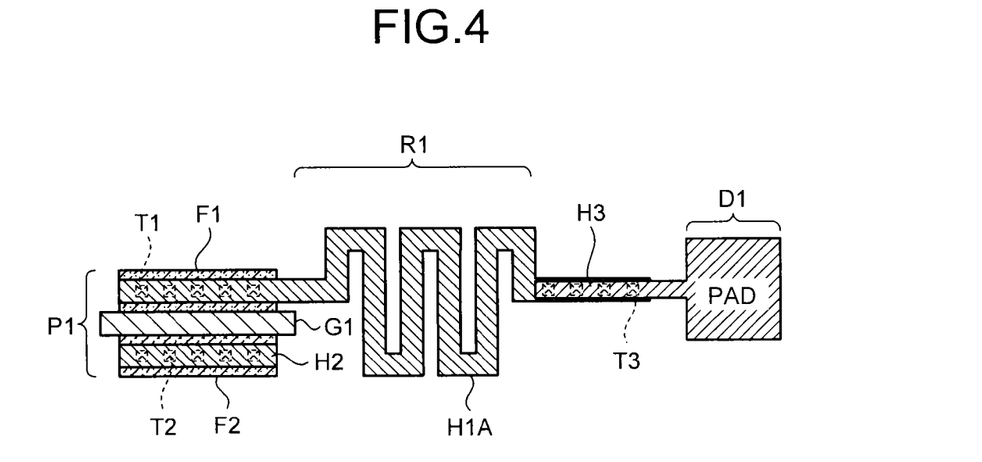
FIG. 4 is a plan view illustrating a configuration example of a P-type transistor and a resistor of an ODT circuit applied to a semiconductor device according to a second embodiment.

FIG. 4 is a plan view illustrating a configuration example of a P-type transistor and a resistor in an ODT circuit applied to a semiconductor device according to a second embodiment.

Referring to FIG. 4, a lower-layer wiring H1A is provided in this ODT circuit instead of the lower-layer wiring H1 in FIG. 1. The lower-layer wiring H1A can employ a folding structure outside the diffusion layer F1. Thus, without changing the material of the lower-layer wiring H1A, a resistance value of the lower-layer wiring H1A can be increased and a value of the resistor R1 can be increased.

Third Embodiment

Figure 5A:
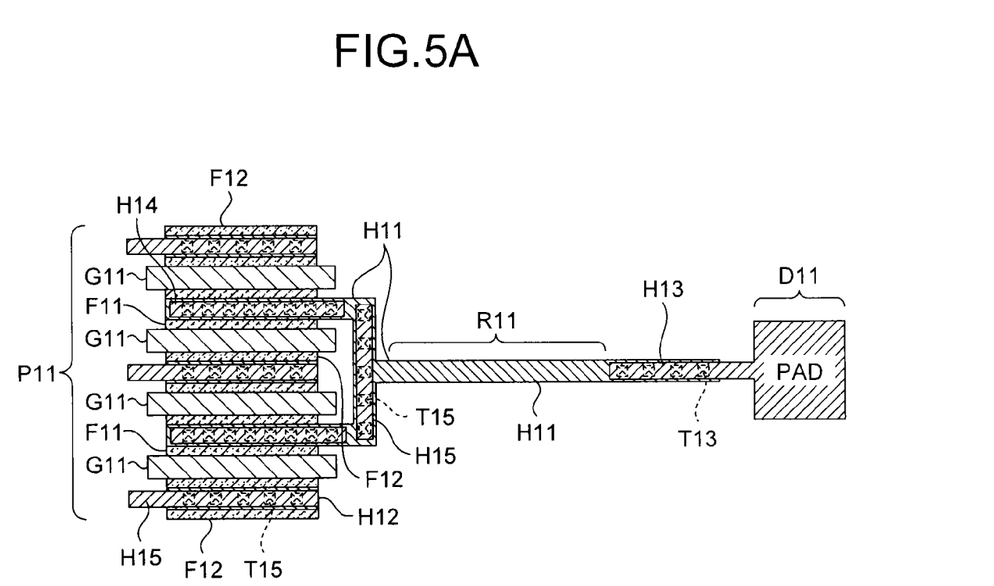
FIG. 5A is a plan view illustrating a configuration example of a P-type transistor and a resistor of an ODT circuit applied to a semiconductor device according to a third embodiment.
Figure 5B:
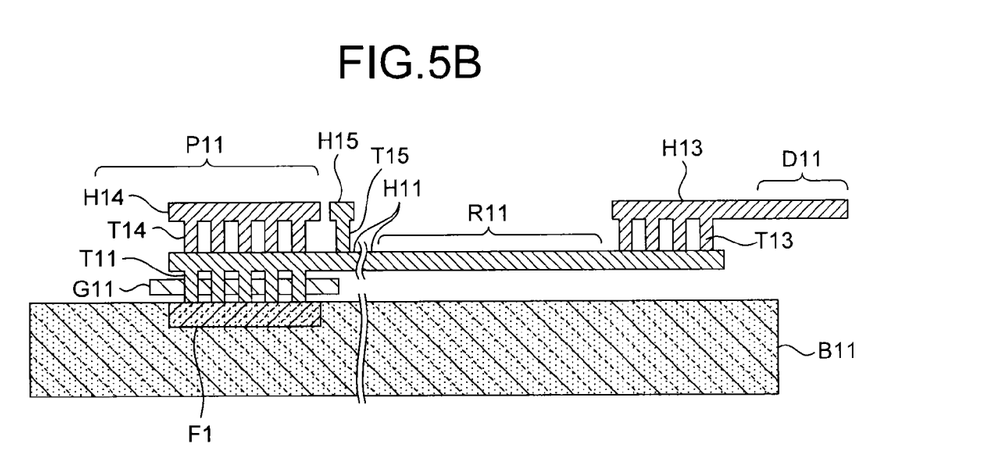
FIG. 5B is a cross-sectional view cut along a wiring H11 in FIG. 5A.

FIG. 5A is a plan view illustrating a configuration example of a P-type transistor and a resistor in an ODT circuit applied to a semiconductor device according to a third embodiment, and FIG. 5B is a cross-sectional view cut along a wiring H11 in FIG. 5A.

Referring to FIG. 5A and FIG. 5B, a semiconductor chip B11 has plural gate electrode G11 provided in parallel. In addition, as a material of the semiconductor chip B11, single-crystal silicon can be used, and as a material of the gate electrode G11, polycrystal silicon can be used. Diffusion layers F11 and F12 are provided on both side of a channel region under the gate electrode G11. In addition, the gate electrode G11 and the diffusion layers F11 and F12 can be used as a P-type transistor P11 in the ODT circuit. At this time, the diffusion layer F11 can compose a drain of the P-type transistor P11, and the diffusion layer F12 can compose a source of the P-type transistor P11.

A lower-layer wiring H11 is formed on the diffusion layer F11, and the lower-layer wiring H11 is drawn outside the diffusion layer F11. The lower-layer wiring H11 is connected to the diffusion layer F11 through a contact T11. In addition, in order to reduce wiring capacity of the lower-layer wiring H11, it is preferable that the lower-layer wiring H11 does not overlap with the gate electrode G11. A lower-layer wiring H12 is formed on the diffusion layer F12, and the lower-layer wiring H12 is connected to the diffusion layer F12 through a contact. An upper-layer wiring H15 is formed on the lower-layer wiring H12, and the upper-layer wiring H15 is connected to the lower-layer wiring H12 through a contact T15.

In addition, a pad electrode D11 is provided in the semiconductor chip B11, and an upper-layer wiring H13 is drawn out from the pad electrode D11. The upper-layer wiring H13 is connected to the lower-layer wiring H11 through a contact T13. The lower-layer wiring H11 can be made of material having resistivity higher than that of the upper-layer wiring H13. At this time, the lower-layer wiring H11 may be made of material having a melting point higher than that of the upper-layer wiring H13, or the lower-layer wiring H11 may be made of material having electromigration resistance higher than that of the upper-layer wiring H13. For example, the lower-layer wiring H11 may be made of W, and the upper-layer wiring H13 may be made of Al. Here, the lower-layer wiring H11 drawn outside the diffusion layer F11 can be used as a resistor R11 connected to the P-type transistor P11 in series in the ODT circuit.

In addition, a back wiring H14 to back up the lower-layer wiring H11 is provided over the diffusion layer F11, and the back wiring H14 is connected to the lower-layer wiring H11 through a contact T14. In addition, the back wiring H14 can be made of material having resistivity lower than that of the lower-layer wiring H11. For example, the back wiring H14 can be made of Al. Furthermore, a back wiring H15 is provided to back up the lower-layer wiring H11, in a section between the resistor R11 and the diffusion layer F11, and the back wiring H15 is connected to the lower-layer wiring H11 through a contact T15.

Here, when the back wirings H14 and H15 to back up the lower-layer wiring H11 are provided, the lower-layer wiring H11 can be divided to a portion to be acted as the resistor R11 and a portion not to be acted as the resistor R11, so that precision of a value of the resistor R11 can be improved.

Fourth Embodiment

Figures 6A, 6B:
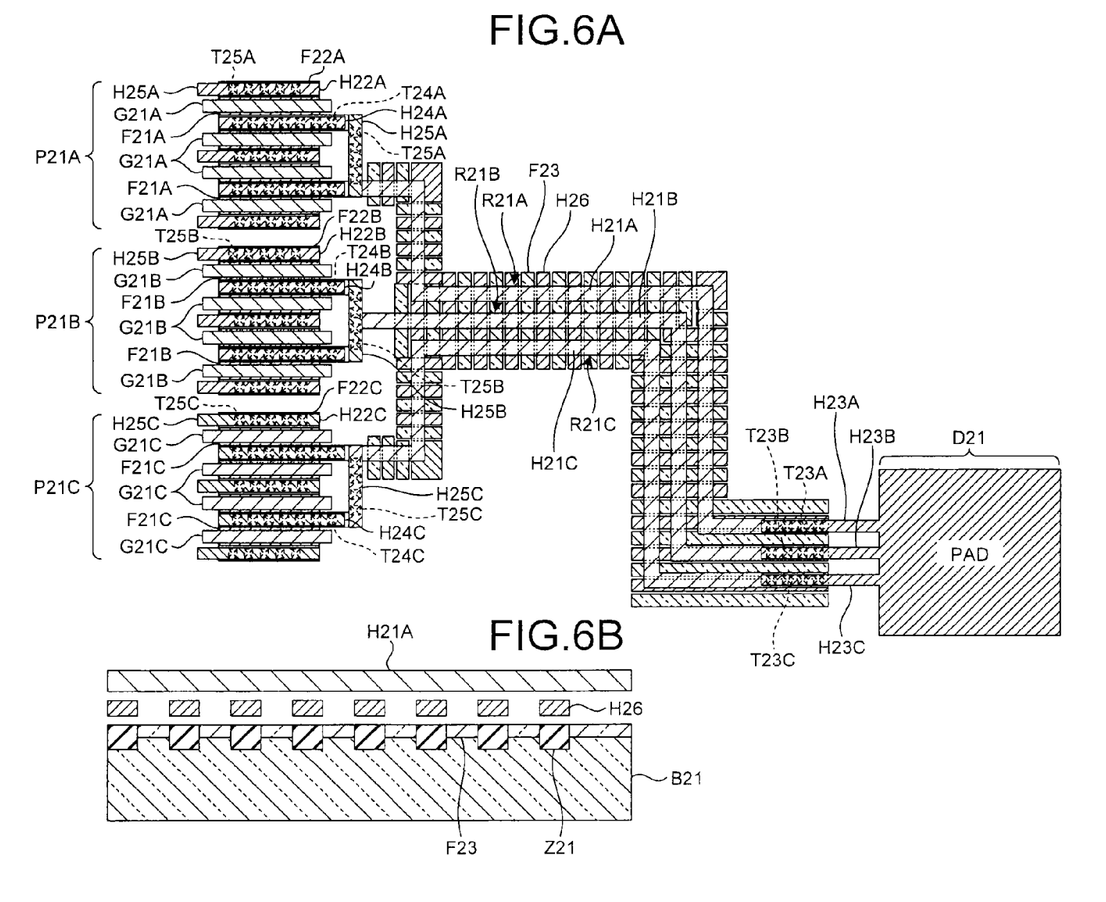
FIG. 6A is a plan view illustrating a configuration example of P-type transistors and resistors of an ODT circuit applied to a semiconductor device according to a fourth embodiment.
FIG. 6B is a cross-sectional view cut along a wiring H21A in FIG. 6A.

FIG. 6A is a plan view illustrating a configuration example of P-type transistors and resistors of an ODT circuit applied to a semiconductor device according to a fourth embodiment, and FIG. 6B is a cross-sectional view cut along a wiring H21A in FIG. 6A.

Referring to FIG. 6A and FIG. 6B, a semiconductor chip B21 has plural P-type transistor P21A, P21B, and P21C. The P-type transistor P21A has plural gate electrode G21A provided in parallel, the P-type transistor P21B has plural gate electrode G21B provided in parallel, and the P-type transistor P21C has plural gate electrode G21C provided in parallel. In addition, as a material of the semiconductor chip B21, single-crystal silicon can be used, and as a material of the gate electrodes G21A, G21B, and G21C, polycrystal silicon can be used. Diffusion layers F21A and F22A are provided on both sides of a channel region under the gate electrode G21A, diffusion layers F21B and F22B are provided on both sides of a channel region under the gate electrode G21B, and diffusion layers F21C and F22C are provided on both sides of a channel region under the gate electrode G21C. At this time, the diffusion layer F21A can compose a drain of the P-type transistor P21A, and the diffusion layer F22A can compose a source of the P-type transistor P21A. The diffusion layer F21B can compose a drain of the P-type transistor P21B, and the diffusion layer F22B can s compose a source of the P-type transistor P21B. The diffusion layer F21C can compose a drain of the P-type transistor P21C, and the diffusion layer F22C can compose a source of the P-type transistor P21C.

The lower-layer wiring H21A is formed on the diffusion layer F21A, and the lower-layer wiring H21A is drawn outside the diffusion layer F21A. The lower-layer wiring H21A is connected to the diffusion layer F21A through a contact. A lower-layer wiring H21B is formed on the diffusion layer F21B, and the lower-layer wiring H21B is drawn outside the diffusion layer F21B. The lower-layer wiring H21B is connected to the diffusion layer F21B through a contact. A lower-layer wiring H21C is formed on the diffusion layer F21C, and the lower-layer wiring H21C is drawn outside the diffusion layer F21C. The lower-layer wiring H21C is connected to the diffusion layer F21C through a contact. In addition, in order to reduce wiring capacity of each of the lower-layer wirings H21A, H21B, and H21C, it is preferable that the lower-layer wirings H21A, H21B, and H21C do not overlap with the gate electrodes G21A, G21B, and G21C, respectively.

Lower-layer wirings H22A, H22B, and H22C are formed on the diffusion layers F22A, F22B, and F22C, respectively, and the lower-layer wirings H22A, H22B, and H22C are connected to the diffusion layers F22A, F22B, and F22C through contacts, respectively. Upper-layer wirings H25A, H25B, and H25C are formed on the lower-layer wirings H22A, H22B, and H22C, respectively, and the upper-layer wirings H25A, H25B, and H25C are connected to the lower-layer wirings H22A, H22B, and H22C, through contacts T25A, T25B, and T25C, respectively.

In addition, a pad electrode D21 is provided in the semiconductor chip B21, and upper-layer wirings H23A, H23B, and H23C are drawn out from the pad electrode D21. The upper-layer wirings H23A, H23B, and H23C are connected to the lower-layer wirings H21A, H21B, and H21C through contacts T23A, T23B, and T23C, respectively.

The lower-layer wirings H21A, H21B, and H21C can be made of material having resistivity higher than those of the upper-layer wirings H23A, H23B, and H23C. At this time, the lower-layer wirings H21A, H21B, and H21C may be made of material having a melting point higher than those of the upper-layer wirings H23A, H23B, and H23C, or the lower-layer wirings H21A, H21B, and H21C may be made of material having electromigration resistance higher than those of the upper-layer wirings H23A, H23B, and H23C. For example, the lower-layer wirings H21A, H21B, and H21C can be made of W, and the upper-layer wirings H23A, H23B, and H23C can be made of Al. Here, the lower-layer wiring H21A drawn outside the diffusion layer F21A can be used as a resistor R21A connected to the P-type transistor P21A in series. The lower-layer wiring H21B drawn outside the diffusion layer F21B can be used as a resistor R21B connected to the P-type transistor P21B in series. The lower-layer wiring H21C drawn outside the diffusion layer F21C can be used as a resistor R21C connected to the P-type transistor P21C in series.

In addition, back wirings H24A, H24B, and H24C to back up the lower-layer wirings H21A, H21B, and H21C are provided over the diffusion layers F21A, F21B, and F21C, respectively, and the back wirings H24A, H24B, and H24C are connected to the lower-layer wirings H21A, H21B, and H21C through contacts T24A, T24B, and T24C, respectively. In addition, the back wirings H24A, H24B, and H24C can be made of material having resistivity lower than those of the lower-layer wirings H21A, H21B, and H21C. For example, the back wirings H24A, H24B, and H24C can be made of Al. Furthermore, back wirings H25A, H25B, and H25C are provided to back up the lower-layer wirings H21A, H21B, and H21C, in sections between the resistors R21A, R21B, and R21C and the diffusion layers F21A, F21B, and F21C, respectively, and the back wirings H25A, H25B, and H25C are connected to the lower-layer wirings H21A, H21B, and H21C through contacts T25A, T25B, and T25C, respectively.

In addition, strip-shaped base diffusion layers F23 which are isolated with STIs (Shallow Trench Isolation) Z21 are formed on the semiconductor chip B21, and strip-shaped base wirings H26 are formed, in a region between the P-type transistors P21A, P21B, and P21C, and the pad electrode D21. In addition, the base wiring H26 can be made of gate electrode material of the P-type transistors P21A, P21B, and P21C. The base diffusion layer F23 and the base wiring H26 can be alternately arranged side by side under the lower-layer wirings H21A, H21B, and H21C so as to intersect with the lower-layer wirings H21A, H21B, and H21C at right angles. At this time, the base diffusion layer F23 and the base wiring H26 can be shared by the plural lower-layer wiring H21A, H21B, and H21C. In addition, the base diffusion layer F23 and the base wiring H26 can be configured into an L shape in a bending portion of the lower-layer wirings H21A, H21B, and H21C. Furthermore, potentials of the base diffusion layer F23 and the base wiring H26 can be set into a floating potential. In addition, the base diffusion layer F23 and the base wiring H26 may be alternately arranged side by side, or may be arranged so as to overlap with each other.

Here, when the base diffusion layer F23 and the base wiring H26 are provided as the base layers of the resistors R21A, R21B, and R21C, uniformity in coarseness and fineness of a pattern of the base layer of each of the resistors R21A, R21B, and R21C can be improved. Therefore, when the lower-layer wirings H21A, H21B, and H21C are formed through a damascene process, embedded portions of the lower-layer wirings H21A, H21B, and H21C can be prevented from dishing, and a film thickness of each of the lower-layer wirings H21A, H21B, and H21C can be uniformly provided, so that values of the resistors R21A, R21B, R21C can be prevented from varying. In addition, when the potentials of the base diffusion layer F23 and the base wiring H26 are set into the floating potential, parasitic capacity between the resistors R21A, R21B, and R21C and the base layers can be reduced, so that signal transmission speed can be improved.

In addition, according to the above embodiments, the description has been given of the configuration in which the base diffusion layer F23 and the base wiring H26 are provided as the base layers of the resistors R21A, R21B, and R21C, but as another configuration, the base diffusion layer F23 and the base wiring H26 may be completely removed from under the resistors R21A, R21B, and R21C, and an insulator solid pattern may be provided as the base layer of the resistors R21A, R21B, and R21C.

Fifth Embodiment

Figure 7:
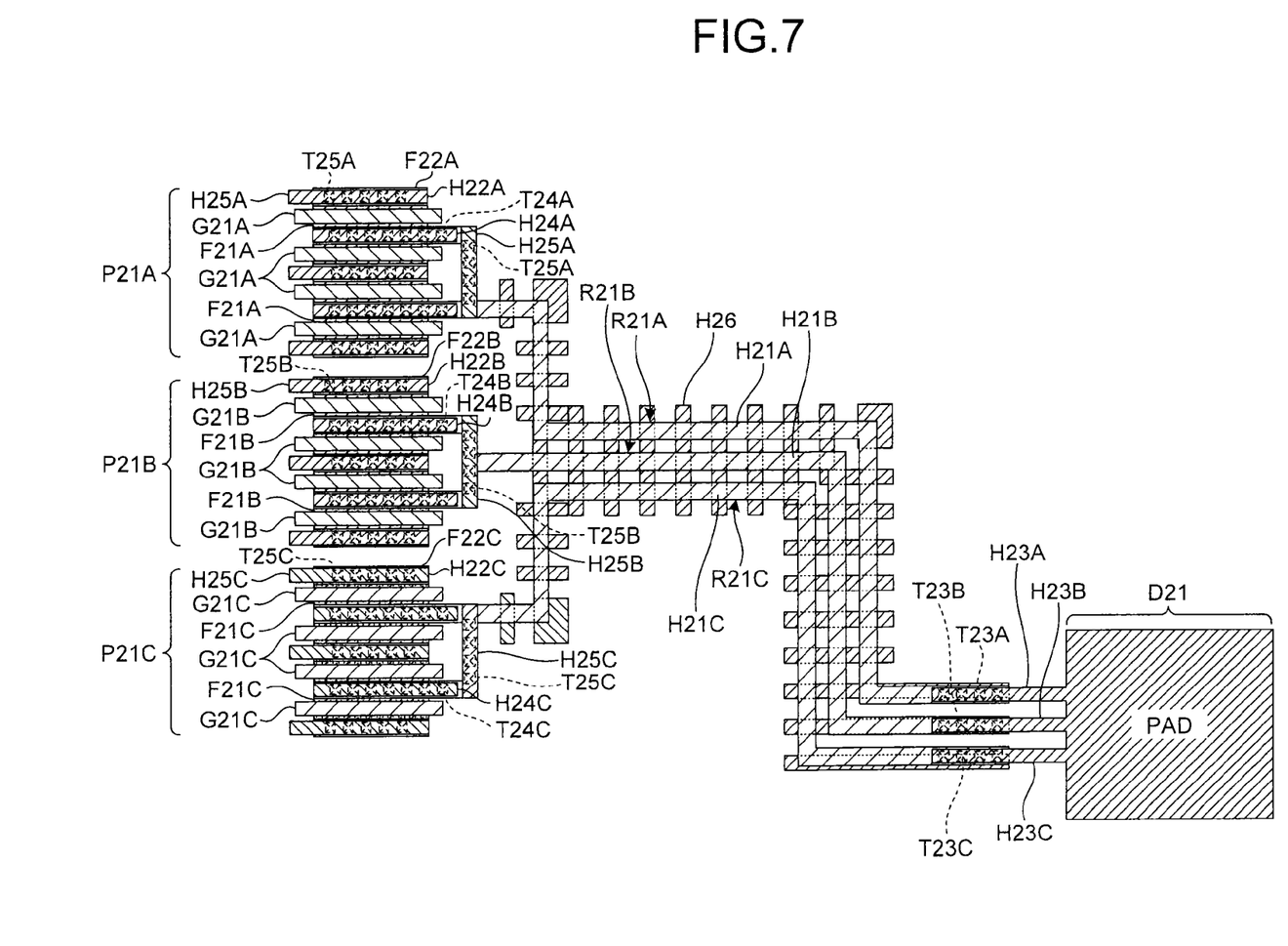
FIG. 7 is a plan view illustrating a configuration example of P-type transistors and resistors of an ODT circuit applied to a semiconductor device according to a fifth embodiment.

FIG. 7 is a plan view illustrating a configuration example of P-type transistors and resistors in an ODT circuit applied to a semiconductor device according to a fifth embodiment.

Referring to FIG. 7, in this ODT circuit, the base diffusion layer F23 in FIG. 6A has been removed, and the base wiring H26 is provided as the base layer of the resistor R21A, R21B, and R21C. Here, by removing the base diffusion layer F23 in FIG. 6A, the parasitic capacity between the resistors R21A, R21B, and R21C, and the base diffusion layer F23 can be eliminated, so that the signal transmission speed can be improved.

Sixth Embodiment

Figure 8A:
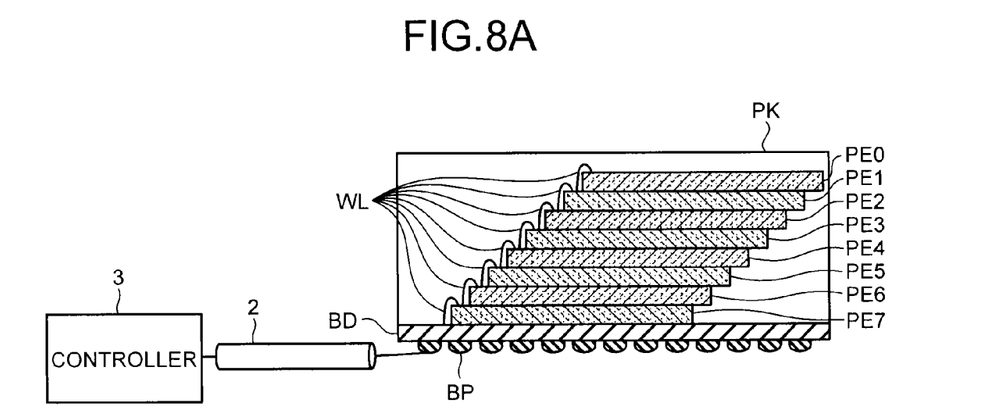
FIG. 8A is a cross-sectional view illustrating a system configuration of a semiconductor device according to a sixth embodiment.
Figure 8B:
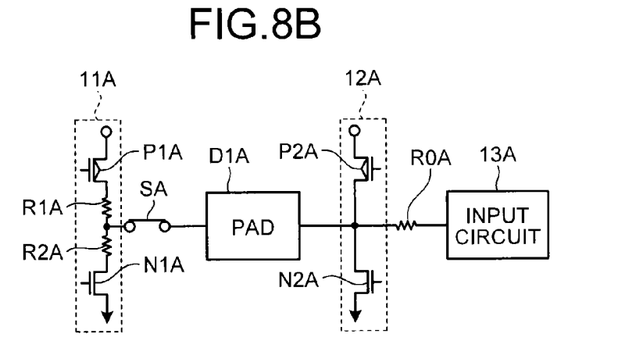
FIG. 8B is a block diagram illustrating a connection state of an ODT circuit 11A on a semiconductor chip PE0 in FIG. 8A.
Figure 8C:
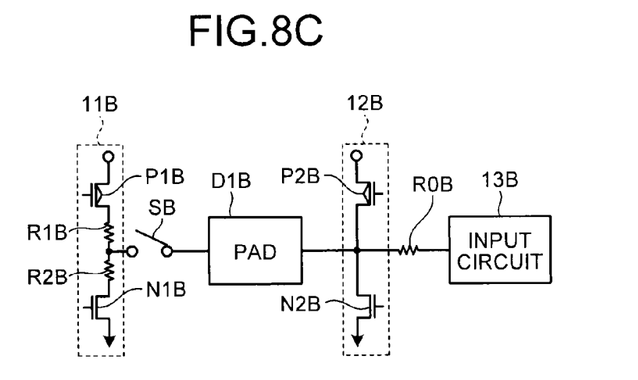
FIG. 8C is a block diagram illustrating a connection state of an ODT circuit 11B on each of semiconductor chips PE1 to PE7 in FIG. 8A.

FIG. 8A is a cross-sectional view illustrating a system configuration of a semiconductor device according to a sixth embodiment, FIG. 8B is a block diagram illustrating a connection condition of an ODT circuit 11A of a semiconductor chip PE0 in FIG. 8A, and FIG. 8C is a block diagram illustrating a connection condition of an ODT circuit 11B of each of the semiconductor chips PE1 to PE7 in FIG. 8A.

Referring to FIG. 8A, a circuit board BD is provided in a package PK, and the semiconductor chips PE0 to PE7 are mounted on the circuit board BD. IO terminals BP are provided on a back surface of the circuit board BD. Here, the semiconductor chip PE0 includes a pad electrode D1A, the ODT circuit 11A, an output buffer 12A, a protective resistor R0A, and an input circuit 13A. The ODT circuit 11A includes a P-type transistor P1A, an N-type transistor N1A, and resistors R1A and R2A. The output buffer 12A includes a P-type transistor P2A and an N-type transistor N2A. Here, the pad electrode D1A is connected to the ODT circuit 11A through a wiring SA drawn out from the pad electrode D1A. Each of the semiconductor chips PE1 to PE7 includes a pad electrode D1B, the ODT circuit 11B, an output buffer 12B, a protective resistor R0B, and an input circuit 13B. The ODT circuit 11B includes a P-type transistor P1B, an N-type transistor N1B, and resistors R1B and R2B. The output buffer 12B includes a P-type transistor P2B, and an N-type transistor N2B. Here, the pad electrode D1B is separated from the ODT circuit 11B because a wiring SB drawn out from the pad electrode D1B is cut. In addition, the resistors R1A, R2A, R1B, and R2B may have the same configurations as those shown in FIG. 3A, FIG. 4, FIG. 5A, FIG. 6A or FIG. 7.

The semiconductor chips PE0 to PE7 are stacked so as to be shifted in position so that the pad electrodes D1A and D1B are exposed. Thus, the pad electrodes D1A and D1B are connected to the IO terminals BP through bonding wires WL to be connected to the same channel. The IO terminal BP is connected to the controller 3 through the transmission line 2.

Thus, when a signal is inputted to any one of the pad electrodes D1A and D1B of the semiconductor chips PE0 to PE7, the P-type transistors P2A and P2B, and the N-type transistors N2A and N2B are turned off. In addition, the P-type transistor P1A and the N-type transistor N1A are turned on, so that the pad electrodes D1A and D1B are set to the middle potential between the power supply potential VCC and the ground potential GND. At this time, when a combined resistance value of the resistors R1A and R2A is conformed to the resistance value of the transmission line 2, the impedance matching with the transmission line 2 can be achieved. Therefore, the signals inputted to the pad electrodes D1A and D1B through the transmission line 2 can be prevented from being reflected, and the signals can be efficiently transmitted. In addition, the upper and lower limits of the signals inputted to the pad electrodes D1A and D1B through the transmission line 2 can be limited by the resistors R1A and R2A, so that the signal can be reduced in amplitude.

In addition, when the ODT circuit 11A is shared by the pad electrodes D1A and D1B, capacity of the ODT circuit 11B added to the pad electrode D1B can be eliminated, so that pin capacity of the IO terminal BP can be reduced.

For example, an IO pad of the semiconductor chip having the ODT element is heavier in capacity (CL) than that of the IO pad of the semiconductor chip not having the ODT terminal by about 30%. When total capacity of the IO pad in the channel is heavy, the IO pad cannot be driven at high speed, so that transfer efficiency of IO data is reduced. For example, in a case where eight semiconductor chips sharing the IO pad exist in the one package, when the semiconductor chips each having the same ODT element are mounted, the pin capacity CIO1 of the one IC terminal in the package is expressed by the following equation.

CIO1=package wiring capacity+capacity of chip with ODT(1.3×CL)×8

Since the package wiring capacity is close to the capacity of the chip with the ODT, the following equation is provided.

CIO1=1.3×CL+1.3×CL×8=1.3×CL×9=11.7×CL

Meanwhile, when only one chip has the ODT element among the eight chips, and the other chips do not have the ODT element, pin capacity CIO2 of the one IO terminal in the package is expressed by the following equation.

CIO2=package wiring capacity+capacity of chip without ODT(CL)×7+capacity of chip with ODT (1.3×CL)=1.3×CL×2+CL×7=9.6×CL Therefore, it is found that CIO1=11.7×CL=11.7/9.6× CIO2=1.22×CIO2, so that the pin capacity is reduced by about 22%.

In addition, in the example in FIG. 8, the description has been given of the configuration in which the ODT circuit 11B is provided in each of the semiconductor chips PE1 to PE7 and the pad electrode D1B and the ODT circuit 11B are separated by cutting the wiring SB drawn out from the pad electrode D1B, but the ODT circuit 11B may not be provided in each of the semiconductor chips PE1 to PE7.

Seventh Embodiment

Figure 9:
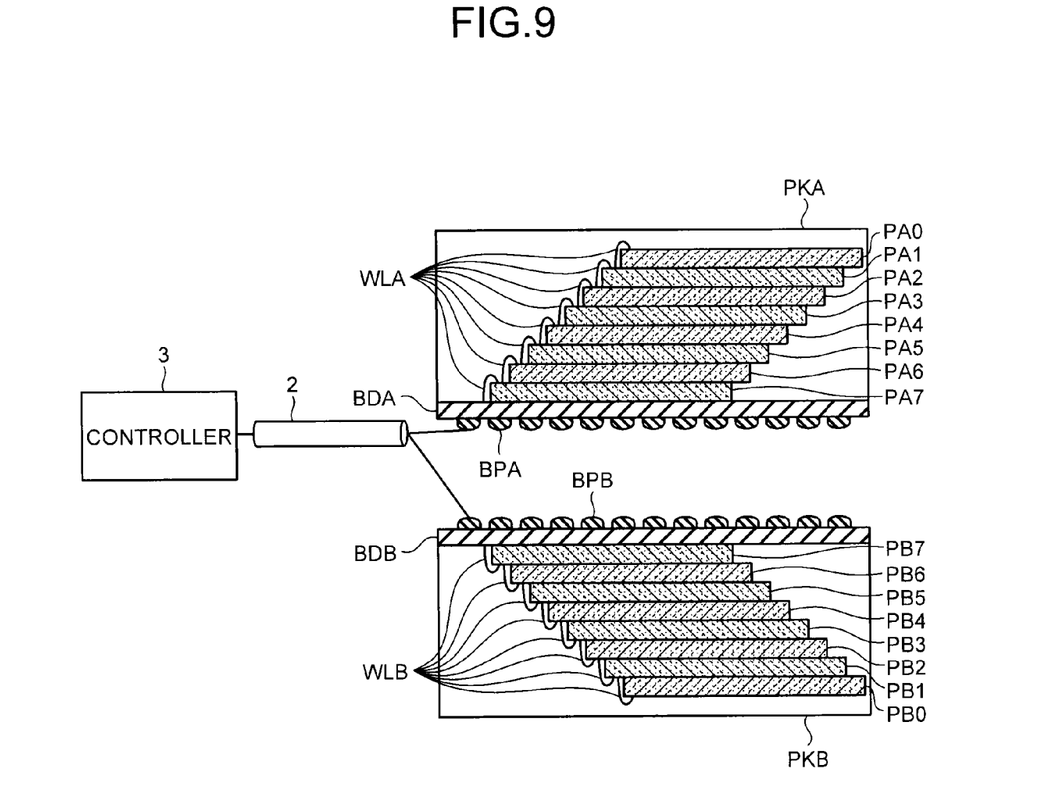
FIG. 9 is a cross-sectional view illustrating a system configuration of a semiconductor device according to a seventh embodiment.

FIG. 9 is a cross-sectional view illustrating a system configuration of a semiconductor device according to a seventh embodiment.

Referring to FIG. 9, a circuit board BDA is provided in a package PKA, and semiconductor chips PA0 to PA7 are mounted on the circuit board BDA. IO terminals BPA are provided on a back surface of the circuit board BDA. A pad electrode of each of the semiconductor chips PA0 to PA7 is connected to the IO terminal BPA through a bonding wire WLA to be connected to the same channel. In addition, this package PKA has the same configuration as that of the package PK in FIG. 8. Meanwhile, a circuit board BDB is provided in a package PKB, and semiconductor chips PB0 to PB7 are mounted on the circuit board BDB. IO terminals BPB are provided on a back surface of the circuit board BDB. A pad electrode of each of the semiconductor chips PB0 to PB7 is connected to the IO terminal BPB through a bonding wire WLB to be connected to the same channel. Each of the semiconductor chips PB0 to PB7 includes the pad electrode D1B, the ODT circuit 11B, the output buffer 12B, the protective resistor R0B, and the input circuit 13B provided in FIG. 8C. Here, the pad electrode D1B is separated from the ODT circuit 11B by cutting the wiring SB drawn out from the pad electrode D1B. The IO terminals BPA and BPB are connected to the controller 3 through the transmission line 2, whereby the same channel configuration is provided between the packages PKA and PKB.

Thus, when a signal is inputted to any one of the pad electrodes D1A and D1B of the semiconductor chips PA0 to PA7, and PB0 to PB7, the P-type transistors P2A and P2B, and the N-type transistors N2A and N2B are turned off. In addition, the P-type transistor P1A and the N-type transistor N1A are turned on, so that the pad electrodes D1A and D1B are set to the middle potential between the power supply potential VCC and the ground potential GND. At this time, when the combined resistance value of the resistors R1A and R2A is conformed to the resistance value of the transmission line 2, the impedance matching with the transmission line 2 can be achieved. Therefore, the signals inputted to the pad electrodes D1A and D1B through the transmission line 2 can be prevented from being reflected, and the signals can be efficiently transmitted. In addition, the upper and lower limits of the signals inputted to the pad electrodes D1A and D1B through the transmission line 2 can be limited by the resistors R1A and R2A, and the signal can be reduced in amplitude.

In addition, the ODT circuit 11A is shared by the pad electrodes D1A and D1B of plural package of PKA and PKB, so that capacity of the ODT circuit 11B added to the pad electrode D1B in the plural package of PKA and PKB can be eliminated, so that pin capacity of the IO terminals BPA and BPB can be reduced.

Eighth Embodiment

Figure 10:
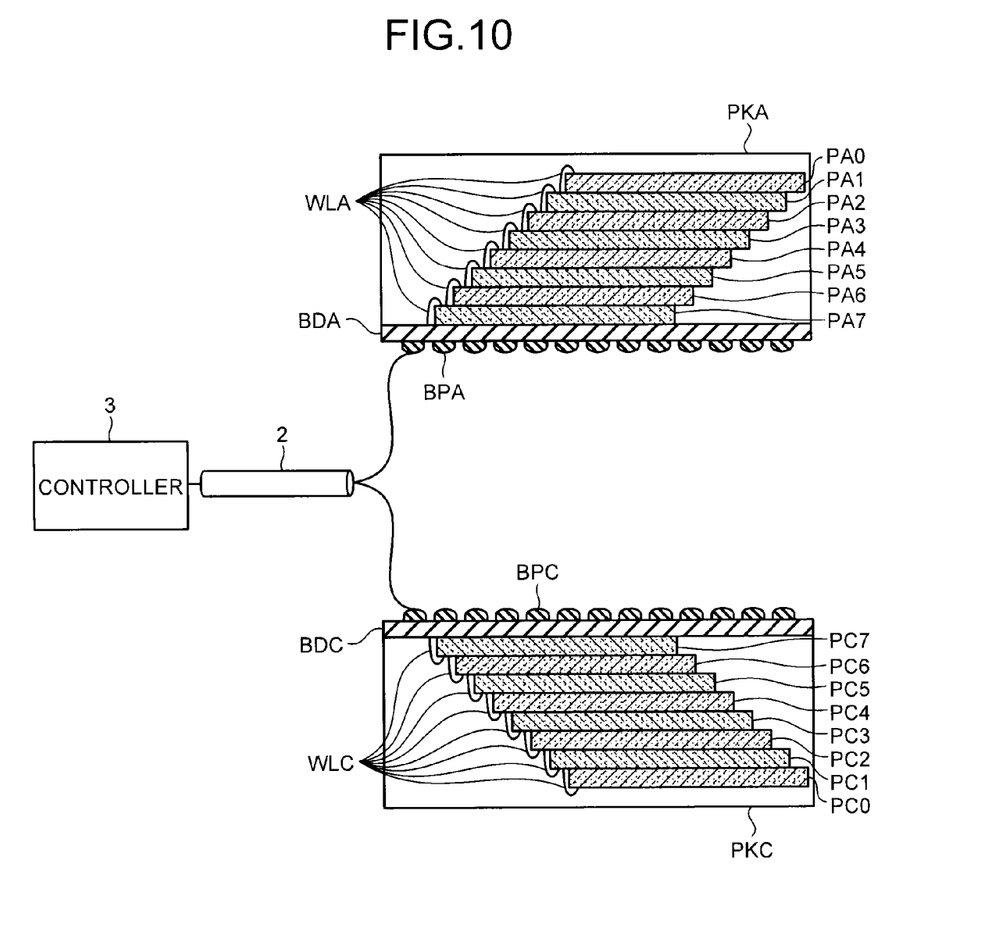
FIG. 10 is a cross-sectional view illustrating a system configuration of a semiconductor device according to an eighth embodiment.

FIG. 10 is a cross-sectional view illustrating a system configuration of a semiconductor device according to an eighth embodiment.

Referring to FIG. 10, the circuit board BDA is provided in the package PKA, and the semiconductor chips PA0 to PA7 are mounted on the circuit board BDA. The IO terminals BPA are provided on the back surface of the circuit board BDA. The pad electrode of each of the semiconductor chips PA0 to PA7 is connected to the IO terminal BPA through the bonding wire WLA to be connected to the same channel. A circuit board BDC is provided in a package PKC, and semiconductor chips PC0 to PC7 are mounted on the circuit board BDC. IO terminals BPC are provided on a back surface of the circuit board BDC. A pad electrode of each of the semiconductor chips PC0 to PC7 is connected to the IO terminal BPC through a bonding wire WLC to be connected to the same channel. In addition, the packages PKA and PKC have the same configuration as that of the package PK in FIG. 8. The IO terminals BPA and BPC are connected to the controller 3 through the transmission line 2, whereby the same channel configuration is provided between the packages PKA and PKC.

Thus, when a signal is inputted to any one of the pad electrodes D1A and D1B of the semiconductor chips PA0 to PA7 in the package PKA, the P-type transistors P2A and P2B, and the N-type transistors N2A and N2B in the semiconductor chips PA0 to PA7 and PC0 to PC7 are turned off. In addition, the P-type transistor P1A and the N-type transistor N1A in the semiconductor chip PA0 in the package PKA are turned off, and the P-type transistor P1A and the N-type transistor N1A of the semiconductor chip PC0 in the package PKC are turned on, so that the pad electrodes D1A and D1B of the semiconductor chips PC0 to PC7 in the package PKC are set to the middle potential between the power supply potential VCC and the ground potential GND.

At this time, when the combined resistance value of the resistors R1A and R2A is conformed to the resistance value of the transmission line 2, the impedance matching with the transmission line 2 can be achieved. Therefore, the signal inputted to the pad electrodes D1A and D1B in the package PKC through the transmission line 2 can be prevented from being reflected, and a reflected wave from the side of the package PKC can be prevented from being inputted to the side of the package PKA, so that the signal on the side of the package PKA can be efficiently transmitted.

Meanwhile, when a signal is inputted to any one of the pad electrodes D1A and D1B of the semiconductor chips PC0 to PC7 in the package PKC, the P-type transistors P2A and P2B, and N-type transistors N2A and N2B of the semiconductor chips PA0 to PA7 and PC0 to PC7 are turned off. In addition, the P-type transistor P1A and the N-type transistor N1A in the semiconductor chip PC0 in the package PKC are turned off, and the P-type transistor P1A and the N-type transistor N1A of the semiconductor chip PA0 in the package PKA are turned on, so that the pad electrodes D1A and D1B of the semiconductor chips PA0 to PA7 in the package PKA are set to the middle potential between the power supply potential VCC and the ground potential GND.

At this time, when the combined resistance value of the resistors R1A and R2A is conformed to the resistance value of the transmission line 2, the impedance matching with the transmission line 2 can be achieved. Therefore, the signal inputted to the pad electrodes D1A and D1B in the package PKA through the transmission line 2 can be prevented from being reflected, and the reflected wave from the side of the package PKA can be prevented from being inputted to the side of the package PKC, so that the signal on the side of the package PKC can be efficiently transmitted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a transistor formed on a semiconductor chip;
a lower-layer wiring connected to a diffusion layer of the transistor, and drawn outside the diffusion layer; and
an upper-layer wiring drawn out from a pad electrode formed on the semiconductor chip, connected to the lower-layer wiring, and having resistivity lower than that of the lower-layer wiring, wherein
the lower-layer wiring has a folding structure outside the diffusion layer.

2. The semiconductor device according to claim 1, wherein
the transistor includes:
a P-type transistor; and
an N-type transistor, and
the lower-layer wiring includes:
a first lower-layer wiring serving as a first resistor connected to the P-type transistor in series; and
a second lower-layer wiring serving as a second resistor connected to the N-type transistor in series.

3. The semiconductor device according to claim 2, wherein
the P-type transistor, the N-type transistor, the first resistor, and the second resistor configure an ODT circuit or an output buffer.

4. The semiconductor device according to claim 1, wherein the lower-layer wiring has a melting point higher than that of the upper-layer wiring.

5. The semiconductor device according to claim 1, wherein the lower-layer wiring has electromigration resistance higher than that of the upper-layer wiring.

6. The semiconductor device according to claim 1, wherein the lower-layer wiring is made of W, and the upper-layer wiring is made of Al or Cu.

7. The semiconductor device according to claim 1, further comprising:
a back wiring to back up the lower-layer wiring, over the diffusion layer.

8. A semiconductor device comprising:
a transistor formed on a semiconductor chip;
a lower-layer wiring connected to a diffusion layer of the transistor, and drawn outside the diffusion layer; and
an upper-layer wiring drawn out from a pad electrode formed on the semiconductor chip, connected to the lower-layer wiring, and having resistivity lower than that of the lower-layer wiring, a base layer formed into a strip shape under the lower-layer wiring drawn outside the diffusion layer.

9. The semiconductor device according to claim 8, wherein the base layer is formed of a gate electrode material of the transistor.

10. The semiconductor device according to claim 8, wherein
the base layer is formed of a diffusion layer separated by STI embedded in the semiconductor chip.

11. The semiconductor device according to claim 8, wherein
the base layer is shared by a plurality of lower-layer wirings.

12. The semiconductor device according to claim 8, wherein
the base layer intersects with the lower-layer wiring at right angles.

13. The semiconductor device according to claim 8, wherein
the base layer is formed into an L shape in a bending portion of the lower-layer wiring.

14. The semiconductor device according to claim 8, wherein
a potential of the base layer is set into a floating potential.

15. A semiconductor device comprising:
a first semiconductor chip having a first pad electrode connected to an ODT circuit;
a second semiconductor chip having a second pad electrode connected to a same channel as the first pad electrode, and sharing the ODT circuit connected to the first pad electrode; and
a first package having a IO terminal, and mounting the first semiconductor chip and the second semiconductor chip, wherein
the first pad electrode and the second pad electrode are connected to the IO terminal, the ODT circuit not intervening between the first pad electrode and the IO terminal, and the ODT circuit not intervening between the second pad electrode and the IO terminal.

16. The semiconductor device according to claim 15, wherein
the first semiconductor chip and the second semiconductor chip are stacked in the first package.

17. The semiconductor device according to claim 15, further comprising:
another ODT circuit formed on the second semiconductor chip,
wherein
the second pad electrode is cut from another ODT circuit formed on the second semiconductor chip.

18. The semiconductor device according to claim 15, comprising:
a second package different from the first package mounting the first semiconductor chip and the second semiconductor chip, wherein
the second package includes a third semiconductor chip having a third pad electrode connected to the same channel as the first pad electrode, and sharing the ODT circuit formed on the first semiconductor chip.

19. A semiconductor device comprising:
a first package mounting a plurality of first semiconductor chips sharing a first ODT circuit; and
a second package mounting a plurality of second semiconductor chips sharing a second ODT circuit, and composing the same channel with the first semiconductor chips, wherein
the first ODT circuit is turned off and the second ODT circuit is turned on when a signal is inputted to the first semiconductor chip, and the second ODT circuit is turned off and the first ODT circuit is turned on when a signal is inputted to the second semiconductor chip.

* * * * *